(12) United States Patent
Minari et al.

(10) Patent No.: US 9,445,494 B2
(45) Date of Patent: Sep. 13, 2016

(54) WIRING SUBSTRATE AND DISPLAY PANEL COMPRISING SAME

(75) Inventors: Chiaki Minari, Osaka (JP); Kiyoshi Minoura, Osaka (JP); Tokio Taguchi, Osaka (JP); Takao Imaoku, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 57 days.

(21) Appl. No.: 14/119,222

(22) PCT Filed: May 14, 2012

(86) PCT No.: PCT/JP2012/062315
§ 371 (c)(1),
(2), (4) Date: Nov. 21, 2013

(87) PCT Pub. No.: WO2012/161020
PCT Pub. Date: Nov. 29, 2012

(65) Prior Publication Data
US 2014/0124243 A1      May 8, 2014

(30) Foreign Application Priority Data

May 23, 2011  (JP) .................................. 2011-114785

(51) Int. Cl.
*G02F 1/1343*     (2006.01)
*G02F 1/136*      (2006.01)
(Continued)

(52) U.S. Cl.
CPC ............. *H05K 1/0274* (2013.01); *G02B 1/118* (2013.01); *G02F 1/136286* (2013.01); *G02F 2001/136295* (2013.01); *G02F 2201/38* (2013.01)

(58) Field of Classification Search
CPC .............. H05K 1/0274; G02F 1/1343; G02F 2001/136295; G02F 1/136286; G02F 2201/38; G02B 1/118
USPC .......................... 349/137, 143, 113, 43, 139
See application file for complete search history.

(56) References Cited

U.S. PATENT DOCUMENTS

2004/0169791 A1* 9/2004 Nilsen et al. ................... 349/96
2005/0194896 A1* 9/2005 Sugita et al. ................. 313/506
(Continued)

FOREIGN PATENT DOCUMENTS

JP       2005156695 A     6/2005
JP       2005-251488 A    9/2005
(Continued)

OTHER PUBLICATIONS

International Preliminary Report on Patentability dated Dec. 5, 2013.
(Continued)

*Primary Examiner* — Nathanael R Briggs
(74) *Attorney, Agent, or Firm* — Harness, Dickey & Pierce, P.L.C.

(57) ABSTRACT

A display panel (100) of an embodiment of the present invention includes a wiring board (100*a*), a counter substrate (100*b*) which is provided on a viewer side of the wiring board (100*a*), and a display medium layer (32) which is provided between the wiring board (100*a*) and the counter substrate (100*b*), wherein the wiring board (100*a*) includes a substrate (11) and a plurality of metal wires (GB, SB, CSB, etc.) provided on the counter substrate (100*b*) side of the substrate (11), and at least part of the plurality of metal wires has a moth-eye structure or inverted moth-eye structure (12M) in its surface.

3 Claims, 7 Drawing Sheets

(51) Int. Cl.
*H05K 1/02* (2006.01)
*G02B 1/118* (2015.01)
*G02F 1/1362* (2006.01)

(56) References Cited

U.S. PATENT DOCUMENTS

| | | | |
|---|---|---|---|
| 2007/0159698 A1 | 7/2007 | Taguchi et al. | |
| 2008/0012471 A1* | 1/2008 | Cok | 313/503 |
| 2009/0066894 A1* | 3/2009 | Kawata et al. | 349/113 |
| 2011/0126903 A1 | 6/2011 | Kobayashi et al. | |
| 2011/0249339 A1 | 10/2011 | Horie | |
| 2011/0285945 A1* | 11/2011 | Aihara | G02F 1/133553 349/113 |
| 2012/0206678 A1* | 8/2012 | Kim | G02F 1/133516 349/106 |
| 2013/0182210 A1* | 7/2013 | Koh | G02F 1/134363 349/141 |

FOREIGN PATENT DOCUMENTS

| | | |
|---|---|---|
| JP | 2010-205804 A | 9/2010 |
| WO | WO-2006059686 A1 | 6/2006 |
| WO | WO-2010/070929 A1 | 6/2010 |
| WO | WO 2010070929 A1 * | 6/2010 |
| WO | WO 2010097975 A1 * | 9/2010 |

OTHER PUBLICATIONS

International Search Report PCT/ISA/210 for International Application No. PCT/JP2012/062315 Dated Jun. 22, 2012.

* cited by examiner (a)

(b)

(a)

(b)

(a)

(b)

WIRING SUBSTRATE AND DISPLAY PANEL COMPRISING SAME

TECHNICAL FIELD

The present invention relates to a wiring board and a display panel including the same.

BACKGROUND ART

Among display panels, such as liquid crystal display panels, reflection of external light at the surface is unfavorable. If the reflectance of external light at the surface is large, images of a viewer himself, objects that are placed around the panel, lighting devices, etc., are reflected in the panel surface, deteriorating the visibility of display. Particularly in a bright environment, excessive reflection of external images occurs. One of the existing solutions to this problem is to provide a low reflection structure at the surface of the display panel such that the reflection of external light is reduced.

As a low reflection structure which reduces the reflection at the surface of the display panel, an antireflection technique which utilizes a so-called "moth-eye" structure has been disclosed (see Patent Documents 1 and 2). By providing an antireflection film which has a moth-eye structure at the surface of the display panel, the reflectance of external light at the surface of the display panel is decreased to about 1% or lower.

However, even if the reflection at the surface of the display panel is reduced, reflection may occur, or the contrast ratio of display may decrease, due to light reflected inside the display panel. Therefore, it is desired to decrease the reflectance inside the display panel independently of reduction in reflectance at the surface of the display panel, preferably together with reduction in reflectance at the surface of the display panel.

The internal reflection of the display panel is now described with an example of a liquid crystal display panel. The liquid crystal display panel includes a pair of substrates and a liquid crystal layer interposed between the substrates. One of the pair of substrates includes pixel electrodes and TFTs that are in a matrix arrangement, and bus lines, for example. This substrate is hereinafter referred to as "TFT substrate". The other substrate includes a counter electrode, a color filter, and a light blocking layer (black matrix). This substrate is hereinafter referred to as "counter substrate". Typically, the counter substrate is placed at the viewer side of the liquid crystal layer. In the example liquid crystal display panel described hereinbelow, the counter substrate is placed at the viewer side of the liquid crystal layer.

External light impinging on the liquid crystal display panel is partially reflected by a surface of the liquid crystal display panel which is in contact with the air (outermost surface). In other words, external light impinging on the liquid crystal display panel is reflected at the interface between the counter substrate and the air. Usually, the counter substrate has a polarizer at the viewer side, and therefore, the reflection occurs at the interface between the surface of the polarizer and the air. In this specification, reflection by the surface of the liquid crystal display panel which is in contact with the air (hereinafter, simply referred to as "the surface of the liquid crystal display panel") is referred to as "surface reflection". Light transmitted through the surface of the liquid crystal display panel is partially reflected by the counter substrate and the TFT substrate. In this specification, reflection other than the surface reflection is referred to as "internal reflection".

The applicant of the present application discloses, in Patent Document 3, a substrate which includes a light blocking layer that has a low reflectance and which is suitably used as a color filter substrate of a liquid crystal display panel. This substrate includes a light blocking layer which includes a high optical density layer and a low optical density layer. The optical densities and refractive indices of the respective layers are adjusted such that reflection which is attributed to a conventional light blocking layer (also known as "black matrix") is reduced.

CITATION LIST

Patent Literature

Patent Document 1: Japanese Laid-Open Patent Publication No. 2005-156695
Patent Document 2: WO 2006/059686
Patent Document 3: WO 2010/070929

SUMMARY OF INVENTION

Technical Problem

However, the internal reflection in a liquid crystal display panel, for example, can be caused not only by the black matrix of the counter substrate but also by wires and electrodes which are formed on the liquid crystal layer side of the TFT substrate. According to the technique disclosed in Patent Document 3, reflection from the TFT substrate of the liquid crystal display panel cannot be reduced. Using a counter substrate that includes a light blocking layer which is disclosed in Patent Document 3 for the purpose of blocking reflected light from the wires of the TFT substrate leads to such a problem that the pixel aperture ratio decreases. This problem is not limited to liquid crystal display panels but is a common problem among display panels which have a wiring board, such as a TFT substrate.

The present invention was conceived for the purpose of solving the above problems. One of the objects of the present invention is to provide a wiring board in which reflection of external light is prevented and a display panel which has such a wiring board. Another one of the objects of the present invention is to provide a method for forming a metal layer which has an antireflection surface.

Solution to Problem

A wiring board of an embodiment of the present invention includes a substrate and a plurality of metal wires provided on the substrate, wherein at least part of the plurality of metal wires has a moth-eye structure or inverted moth-eye structure in its surface.

A display panel of an embodiment of the present invention is a display panel including a wiring board, a counter substrate which is provided on a viewer side of the wiring board, and a display medium layer which is provided between the wiring board and the counter substrate, wherein the wiring board includes a substrate and a plurality of metal wires provided on the counter substrate side of the substrate, and at least part of the plurality of metal wires has a moth-eye structure or inverted moth-eye structure in its surface.

In one embodiment, the counter substrate includes a light blocking layer, and the light blocking layer is arranged so as not to overlap the at least part of the plurality of metal wires.

A metal layer formation method of an embodiment of the present invention for forming a metal layer which has an antireflection surface includes the steps of: providing a mold which has a moth-eye structure or inverted moth-eye structure in its surface; depositing a metal layer on the surface of the mold; attaching a base onto the metal layer; and peeling the metal layer away from the surface of the mold.

Advantageous Effects of Invention

According to an embodiment of the present invention, a wiring board in which reflection of external light is prevented and a display panel which has such a wiring board are provided. According to another embodiment of the present invention, a method for forming a metal layer which has an antireflection surface is provided.

DESCRIPTION OF EMBODIMENTS

Hereinafter, configurations and functions of a wiring board and a display panel according to embodiments of the present invention are described with reference to the drawings. In the following description, a TFT substrate of the liquid crystal display panel is described as an example of the wiring board, although the present invention is not limited to exemplified embodiments. The present invention is applicable to various display panels and wiring boards thereof.

Figure 1:
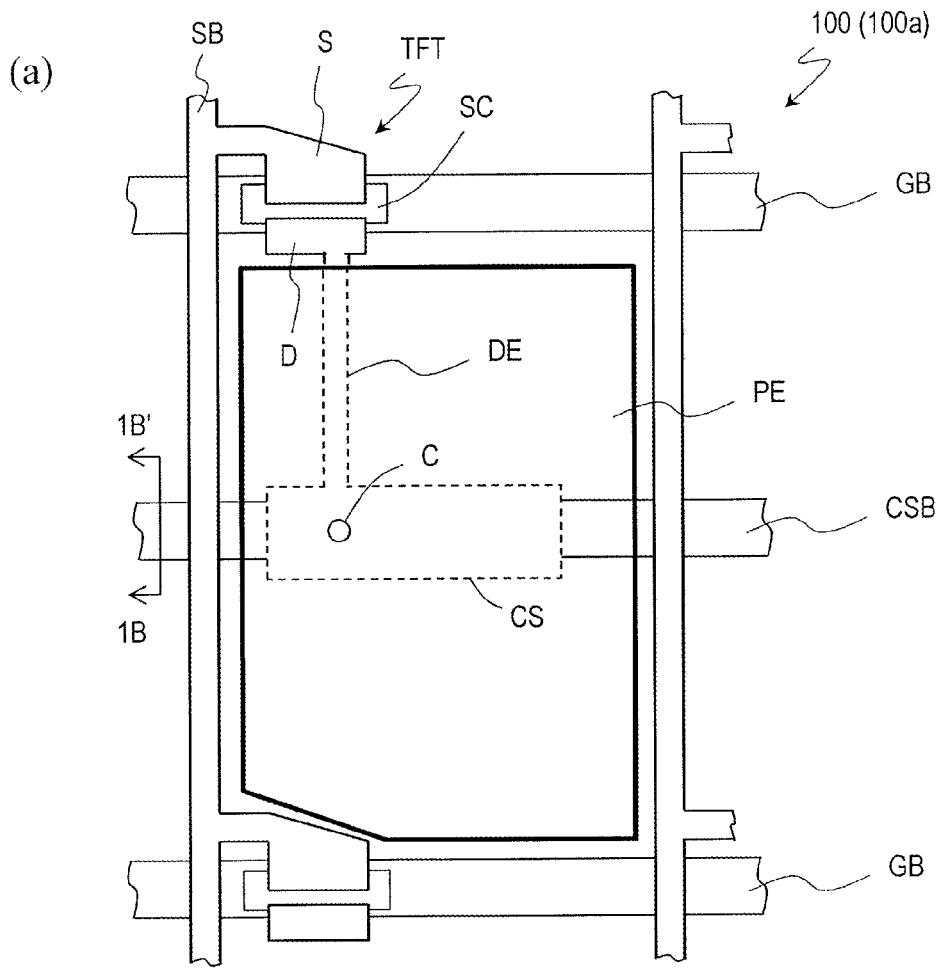
FIG. 1 (a) is a schematic plan view of a liquid crystal display panel 100 of an embodiment of the present invention. (b) is a schematic cross-sectional view of the liquid crystal display panel 100 taken along line 1B-1B' of (a).
Figure 1:
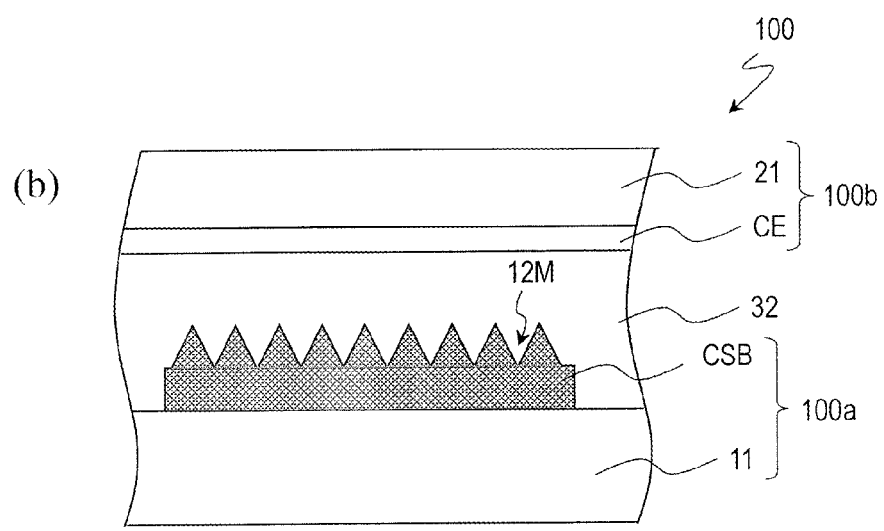

FIG. 1(a) shows a schematic plan view of a liquid crystal display panel 100 of an embodiment of the present invention. FIG. 1(b) shows a schematic cross-sectional view of the liquid crystal display panel 100. FIG. 1(b) is a cross-sectional view taken along line 1B-1B' of FIG. 1(a). FIG. 1(a) shows a planar configuration of a region corresponding to one pixel of a TFT substrate 100a of the liquid crystal display panel 100.

The TFT substrate 100a includes a substrate (e.g., glass substrate) 11, a TFT provided on the substrate 11, a pixel electrode PE, a source bus line SB, a gate bus line GB, and a CS bus line (storage capacitor line) CSB. The source electrode S of the TFT is connected to the source bus line SB, and the drain electrode D is connected to the pixel electrode PE. A semiconductor layer SC is provided on the gate bus line GB, and the gate bus line GB also functions as the gate electrode of the TFT.

The liquid crystal display panel 100 includes the TFT substrate 100a, a counter substrate 100b which is provided on the viewer side of the TFT substrate 100a, and a liquid crystal layer 32 which is a display medium layer interposed between the TFT substrate 100a and the counter substrate 100b. The counter substrate 100b includes a substrate (e.g., glass substrate) 21 and a counter electrode CE which is provided on the liquid crystal layer 32 side of the substrate 21. The pixel electrode PE of the TFT substrate 100a, the counter electrode CE, and the liquid crystal layer 32 interposed therebetween form a pixel. A drain extended line DE is integrally formed with the drain electrode D. An end of the drain extended line DE overlaps the CS bus line CSB with an unshown insulating layer (e.g., gate insulating layer) interposed therebetween, thereby forming a storage capacitance CS. At a contact hole C on the storage capacitance CS, the drain extended line DE and the pixel electrode PE are connected to each other. The gate bus line GB, the source bus line SB, the drain extended line DE, and the CS bus line CSB are metal wires. Note that the drain extended line DE, the storage capacitance CS, and the CS bus line CSB may be omitted. The configuration of the liquid crystal display panel 100 which includes the TFT substrate 100a is well known, and therefore, detailed description thereof is herein omitted. The TFT substrate 100a and the liquid crystal display panel 100 may be variously modified.

In the TFT substrate 100a, as shown in FIG. 1(b), at least part of the metal wire has a moth-eye structure or inverted moth-eye structure (which are generically referred to as "moth-eye type antireflection structure 12M") in its surface. In the example shown in FIG. 1(b), part of the CS bus line CSB has the moth-eye type antireflection structure 12M in its surface. However, part or the entirety of any of the gate bus line GB, the source bus line SB, and the drain extended line DE may have the moth-eye type antireflection structure 12M in its surface.

As described in Patent Document 2, an antireflection film which has a moth-eye structure can be formed by using a porous alumina layer as a mold. Using the porous alumina layer can achieve high manufacturing efficiency. Particularly when using a mold in which the porous alumina layer is provided in the outer perimeter surface of a roll, such an advantage can be obtained that an antireflection film can be continuously formed according to a roll-to-roll method. The entire disclosure of Patent Document 2 is incorporated by reference in this specification.

The cross-sectional shape of minute recessed portions (micropores) of the porous alumina layer that is to be used in production of an antireflection film which has a moth-eye structure is preferably a generally-conical or bell-like shape, and the minute recessed portions may have a stepped lateral surface. It is preferred that the two-dimensional size of the minute recessed portions viewed in a normal direction of the porous alumina layer (opening diameter: $D_p$) is not less than 10 nm and less than 500 nm, and the depth of the minute recessed portions ($D_{depth}$) is generally not less than 10 nm and less than 3000 nm (3 μm). It is also preferred that the bottom portion of the minute recessed portions is tapered (with the deepest part of the bottom portion being pointed). Further, it is preferred that the minute recessed portions are in a closely packed arrangement. Assuming that the shape of the minute recessed portions of the porous alumina layer when viewed in a direction normal to the porous alumina layer is a circle, it is preferred that adjacent circles overlap each other, and a saddle portion is formed between adjacent ones of the minute recessed portions. Note that, when the generally-conical minute recessed portions adjoin one another so as to form saddle portions, the two-dimensional size of the minute recessed portions, $D_p$, is equal to the average adjoining distance $D_{int}$. Thus, the porous alumina layer of the moth-eye mold that is for production of the antireflection film preferably has a configuration in which the minute recessed portions are in an irregular closely-packed arrangement, the minute recessed portions having such dimensions that $D_p=D_{int}$ is not less than 10 nm and less than 500 nm and $D_{depth}$ is generally not less than 10 nm and less than 3000 nm (3 μm).

The moth-eye type antireflection structure 12M that at least part of the CS bus line CSB of the TFT substrate 100a of an embodiment of the present invention has in its surface is preferably a moth-eye structure but may be an inverted moth-eye structure as will be described later. In the following description, the moth-eye structure is sometimes denoted by "Mm", and the inverted moth-eye structure is sometimes denoted by "Mf".

Here, the problem of internal reflection in a conventional liquid crystal display panel is described with reference to FIG. 11.

Figure 11:
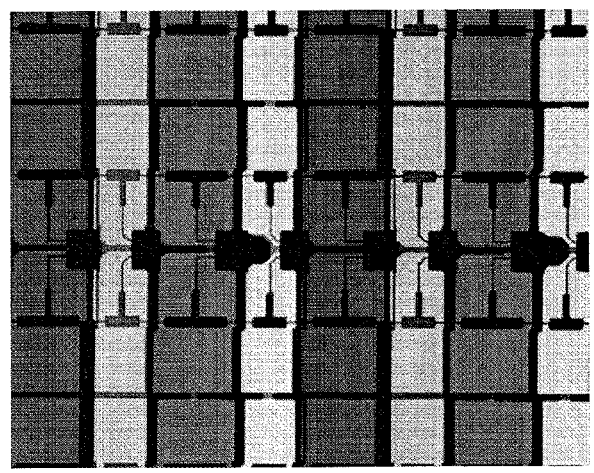
FIG. 11 A diagram showing an optical image of a conventional liquid crystal display panel, showing two color display pixels.

FIG. 11 is a diagram showing an optical image of a 52-inch liquid crystal display panel that was commercially available from the applicant of the present application, showing two color display pixels. One of the color display pixels includes four pixels (primary color pixels). The primary color pixels are in a stripe arrangement. Portions of FIG. 11 which appear black are made of a light blocking material and include metal wires or metal electrodes on the TFT substrate and a light blocking layer (black matrix) provided in the counter substrate 100b. The light blocking layer is arranged so as to overlap, for example, a boundary region of pixels and part of the metal wire. Part of the light blocking layer overlapping the metal wire has a greater width than the metal wire. With such an arrangement of the light blocking layer in the counter substrate 100b, the pixel aperture ratio (the ratio of the area of a portion which transmits light that contributes to display) decreases. Note that the metal wires of the liquid crystal display panel shown in FIG. 11 are copper (Cu) wires.

Since the TFT substrate 100a of an embodiment of the present invention has the moth-eye type antireflection structure 12M in the surface of the metal wires, it is not necessary to form a light blocking layer (black matrix) so as to overlap at least a portion in which the antireflection structure 12M is provided. Therefore, in the case of using the TFT substrate 100a of the present embodiment, internal reflection in the liquid crystal display panel 100 is prevented, and the pixel aperture ratio can be increased.

Note that not all the metal wires of the TFT substrate 100a need to have the antireflection structure 12M in the surface. For example, the antireflection structure 12M may be provided only in the surface of the source bus line SB, and only the light blocking layer provided in a region opposing the source bus line SB may be omitted. As seen in the liquid crystal display panel shown in FIG. 11, the area of the light blocking layer provided in a region opposing the source bus line SB (the light blocking layer which is provided between pixels and which is extending in the vertical direction) is relatively large, and therefore, the effect of increasing the pixel aperture ratio which is achieved by omitting this light blocking layer is relatively large. Note that, as well known in the art, the light blocking layer is formed using, for example, a black photosensitive resin layer in the process of forming a color filter layer with the use of a colored photosensitive resin layer. As a matter of course, the light blocking layer may be formed by a metal layer. Further, the light blocking layer may be formed using a technique disclosed in Patent Document 3. The entire disclosure of Patent Document 3 is incorporated by reference in this specification.

Hereinafter, the relationship between the configuration of the moth-eye type antireflection structure 12M and the reflectance is described with illustration of experimental examples and simulation results.

Figure 2:
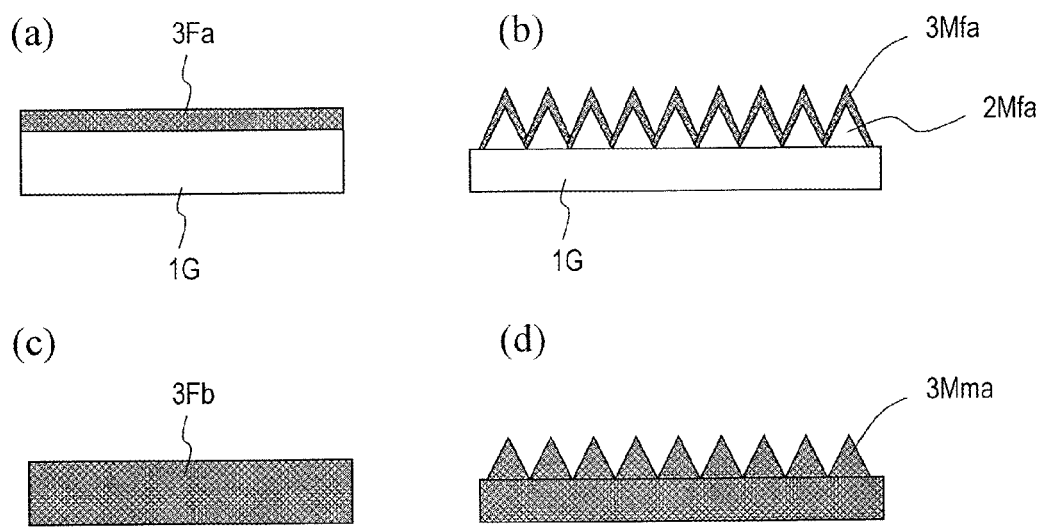
FIG. 2 (a) to (d) are diagrams showing schematic configurations of samples used in measurement of the reflectance.

FIGS. 2(a) to 2(d) show schematic configurations of samples used in measurement of the reflectance. In the sample shown in FIG. 2(a), a gold (Au) layer 3Fa (thickness: 50 nm) which has a flat surface is provided on a glass substrate 1G. In the sample shown in FIG. 2(b), an inverted moth-eye structure 2Mfa which is formed by a porous alumina layer is provided on a glass substrate 1G, and a gold (Au) layer 3Mfa (thickness: 50 nm) is provided on the inverted moth-eye structure 2Mfa. The gold layer 3Mfa has an inverted moth-eye structure. The sample shown in FIG. 2(c) is a nickel (Ni) plate 3Fb which has a flat surface. In the sample shown in FIG. 2(d), a surface 3Mma which has a moth-eye structure is provided on the nickel substrate 3Fb. The nickel surface 3Mma that has a moth-eye structure can be formed by electroforming using the mold of the porous alumina layer (see, for example, Patent Document 2). The moth-eye mold used herein had such dimensions that $D_p=D_{int}$ was about 200 nm, $D_{depth}$ was about 200 nm, and the cross-sectional shape of the recessed portions was generally conical.

Figure 3:
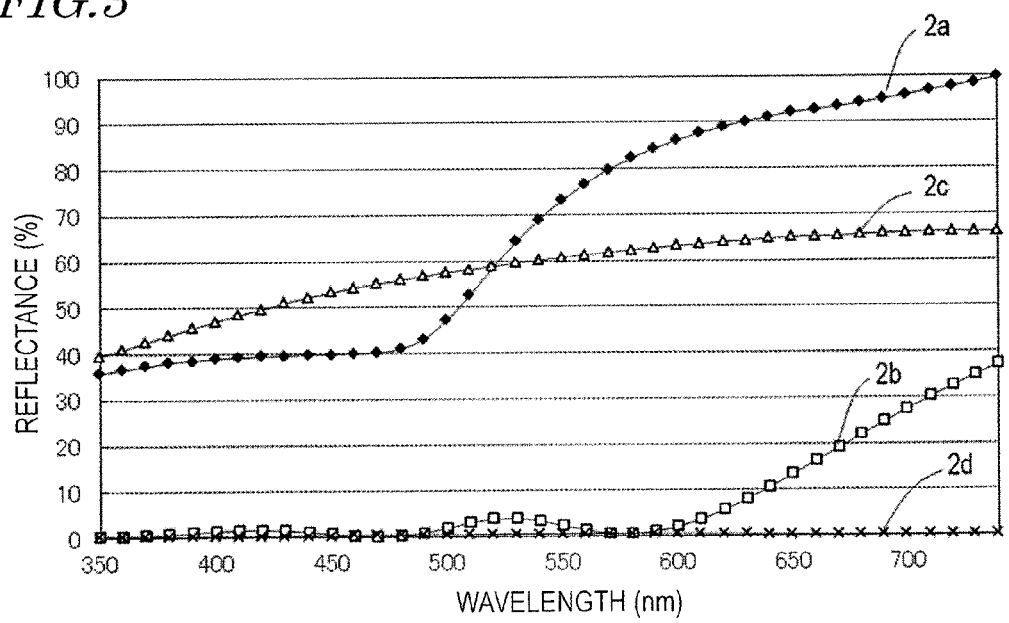
FIG. 3 A graph showing the spectral reflectances of the samples shown in FIGS. 2(a) to 2(d).

FIG. 3 is a graph showing the spectral reflectances of the samples shown in FIGS. 2(a) to 2(d), showing the specular reflectances measured using a spectrocolorimeter (CM-2600d manufactured by KONICA MINOLTA HOLDINGS, INC.). In FIG. 3, curves 2a to 2d represent the spectral reflectances of the samples shown in FIGS. 2(a) to 2(d), respectively.

As seen from the comparison between curve 2a and curve 2b and the comparison between curve 2c and curve 2d in FIG. 3, the reflectances from the flat metal surfaces are high. However, by forming a moth-eye type antireflection structure in the surface, the reflectance can be greatly decreased.

Figure 4:
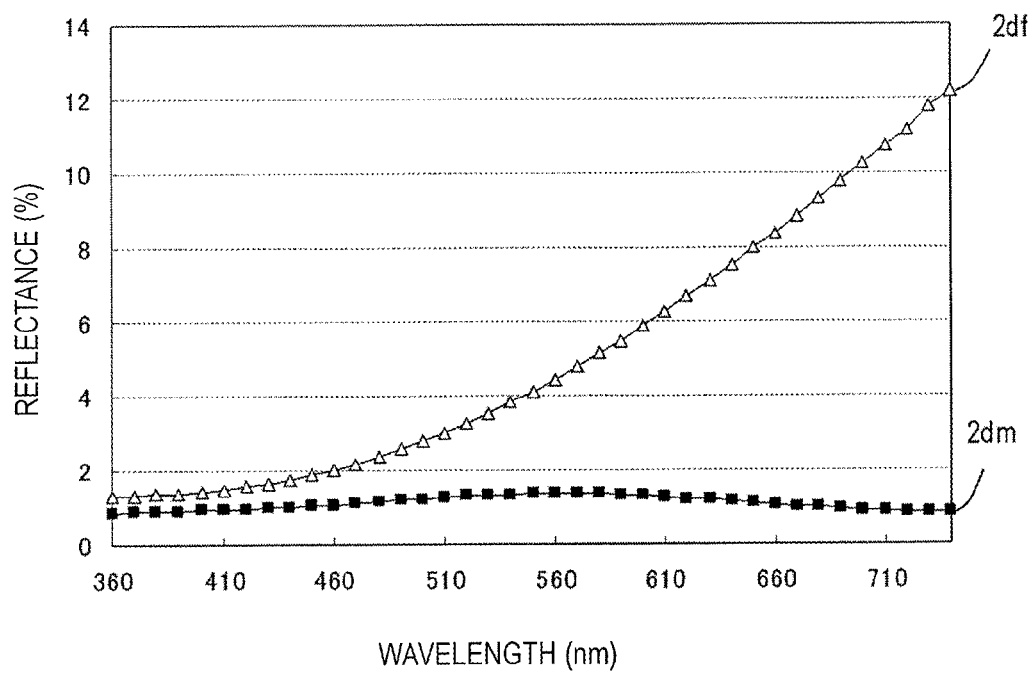
FIG. 4 A graph showing the spectral reflectance of a nickel surface which has a moth-eye structure and the spectral reflectance of a nickel surface which has an inverted moth-eye structure.

Next, the effects on the reflectances of the moth-eye structure and the inverted moth-eye structure are described with reference to FIG. 4. In FIG. 4, curve 2dm represents the spectral reflectance of a nickel surface which had a moth-eye structure (which was the same as the nickel surface 3Mma of FIG. 2(d)), and curve 2df represents the spectral reflectance of a nickel surface which had an inverted moth-eye structure. The nickel surface which had an inverted moth-eye structure was formed by electroforming using an antireflection film which had a moth-eye structure.

As clearly seen from the comparison between curve 2df and curve 2dm, the nickel surface which had a moth-eye structure (curve 2dm) had a greater antireflection effect. However, as clearly seen from the comparison between curve 2df and curve 2c shown in FIG. 3, even the nickel surface which had an inverted moth-eye structure (curve 2df) had an antireflection effect as compared with the flat nickel surface (curve 2c). Note that, when observed by a human eye, the flat nickel surface had a copper-like metallic gloss, while the nickel surface which had an inverted moth-eye structure appeared blackish and had no metallic gloss.

Figure 5:
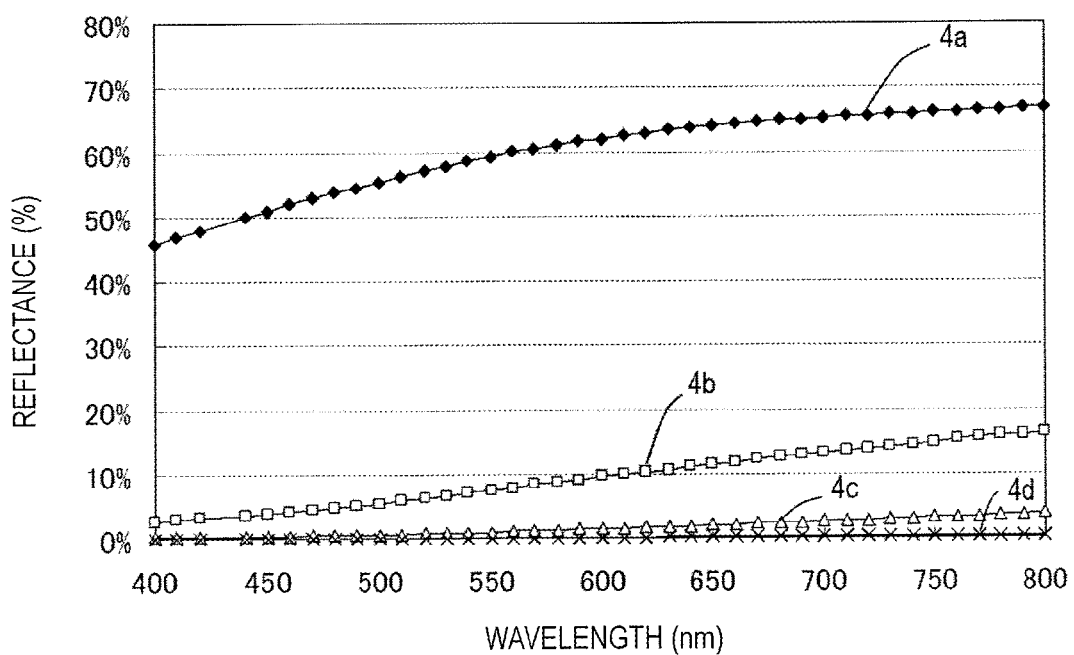
FIG. 5 A graph of the spectral reflectances of nickel surfaces which have moth-eye structures, for illustrating the dependence on the height of raised portions.

Next, the dependence of the spectral reflectance of the nickel surface which had a moth-eye structure on the height of raised portions (corresponding to the depth of recessed portions of the moth-eye mold, $D_{depth}$) is described with reference to FIG. 5. In FIG. 5, for the sake of comparison, the reflectance of the flat nickel surface is represented by curve 4a. Curve 4b represents the simulation result for a moth-eye structure whose raised portions were 300 nm in height. Curve 4c represents the simulation result for a moth-eye structure whose raised portions were 900 nm in height. Curve 4d represents the simulation result for a moth-eye structure whose raised portions were 3000 nm in height.

It can be considered that the refractive index (effective refractive index) of the moth-eye structure is equivalent to the refractive index of a multilayer structure that includes a plurality of layers in which the refractive index increases from the air side to the base side (e.g., nickel base). That is, the refractive index of the moth-eye structure increases stepwise from the air side to the base side. In the exemplified calculation, it was assumed that the number of layers is 30 and the layers have equal thicknesses. The calculation of the reflectances was conducted based on the effective refractive index medium theory (for example, Tadao TSURUTA, *Applied Optics* (Baifu-kan), Chapter 4).

As seen from the results of FIG. 5, the antireflection effect improves as the height of the raised portions increases, although the antireflection effect is obtained even when the height of the raised portions that form the moth-eye structure is 300 nm.

Figure 6:
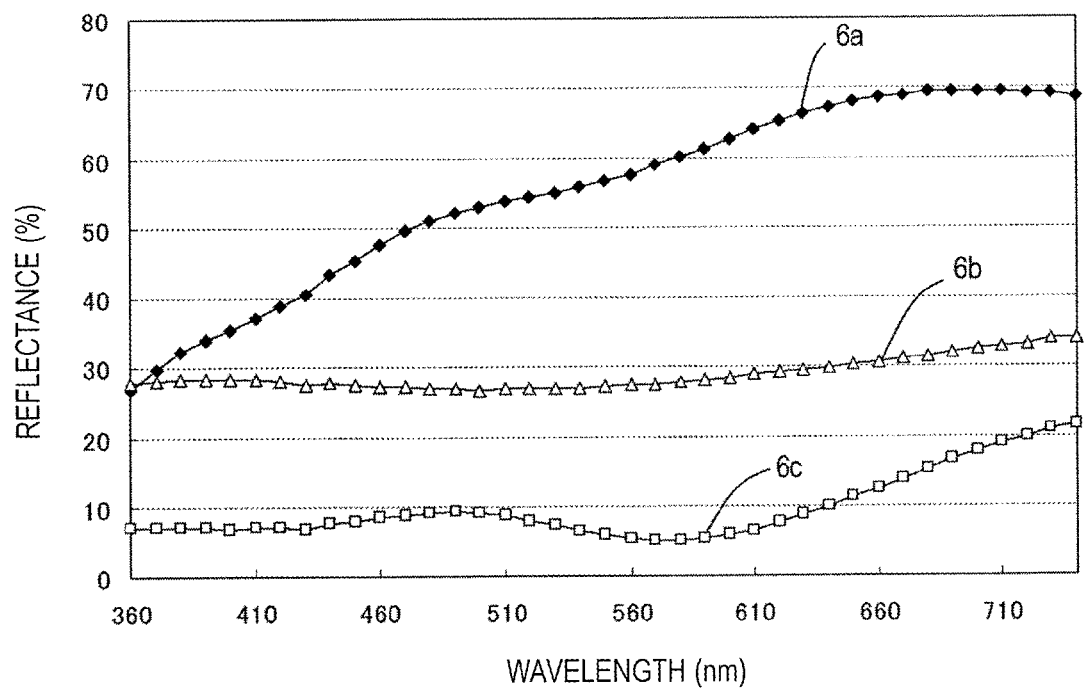
FIG. 6 (a) is a graph of the spectral reflectances of aluminum layers which have inverted moth-eye structures. (b) is a diagram showing a schematic configuration of a sample used in measurement.
Figure 6:
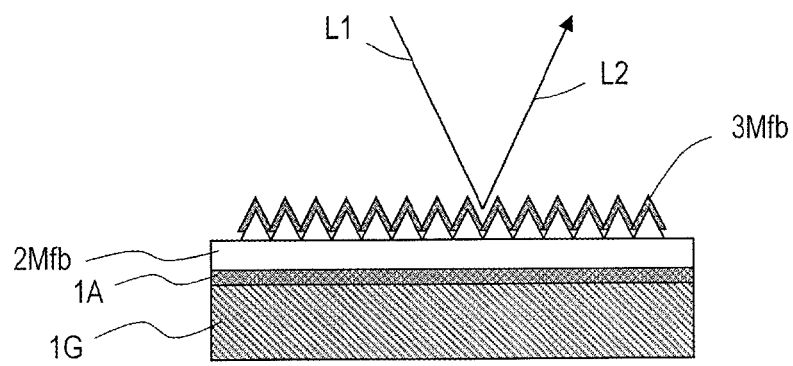

Next, the dependence of the spectral reflectance of an aluminum layer which had an inverted moth-eye structure (incident light L1, reflected light L2) on the thickness of the aluminum layer is described with reference to FIGS. 6(a) and 6(b). The sample used in the experiment was obtained by depositing an aluminum layer 3Mfb on a porous alumina layer 2Mfb which was obtained from an aluminum layer 1A provided on a glass substrate 1G as shown in FIG. 6(b). Note that, for the sake of simplicity, the porous alumina layer 2Mfb is shown as a component including a barrier layer.

In FIG. 6(a), curves 6a, 6b, and 6c represent the results for the cases where the thickness of the aluminum layer 3Mfb was 10 nm, 150 nm, and 50 nm, respectively. When the thickness of the aluminum layer 3Mfb is not more than 10 nm, light which has passed through the aluminum layer 3Mfb is reflected by the underlying aluminum layer 1A so that the reflectance increases. On the other hand, when the thickness of the aluminum layer 3Mfb is not less than 150 nm, the moth-eye structure is deformed by aluminum deposited between the raised portions of the moth-eye structure, and as a result, the reflectance increases. The thickness of the metal layer is preferably more than 10 nm and less than 150 nm and is preferably about 50 nm, although it depends on the formation method of the metal wires.

Figure 7:
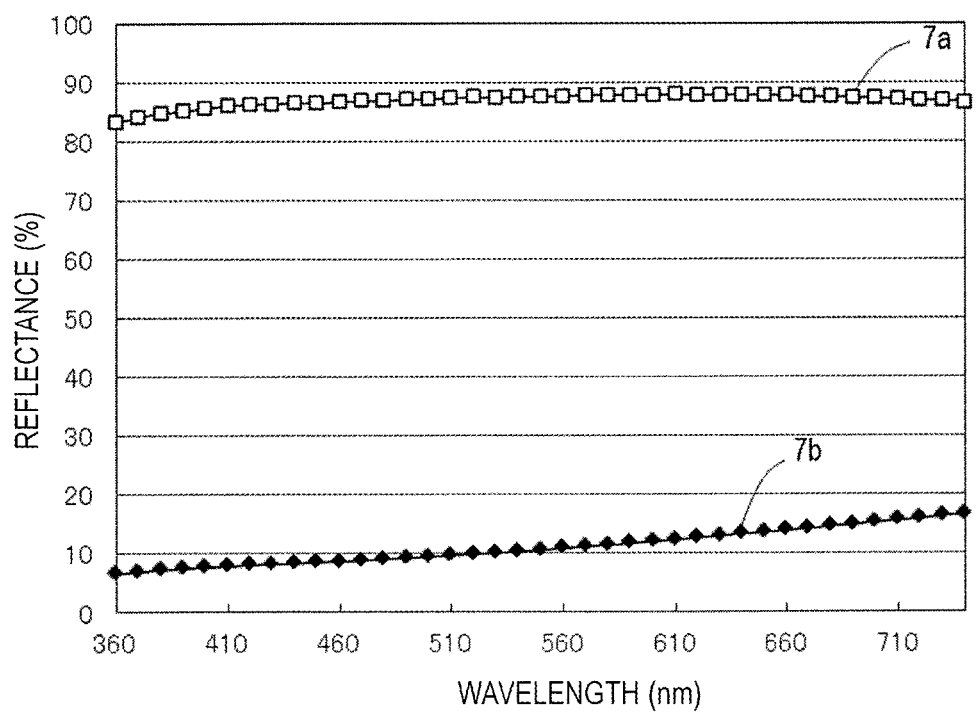
FIG. 7 (a) is a graph showing the spectral reflectance of an aluminum layer which has a flat surface and the spectral reflectance of an aluminum layer which has an inverted moth-eye structure. (b) is a diagram showing a schematic configuration of a sample used in measurement.
Figure 7:
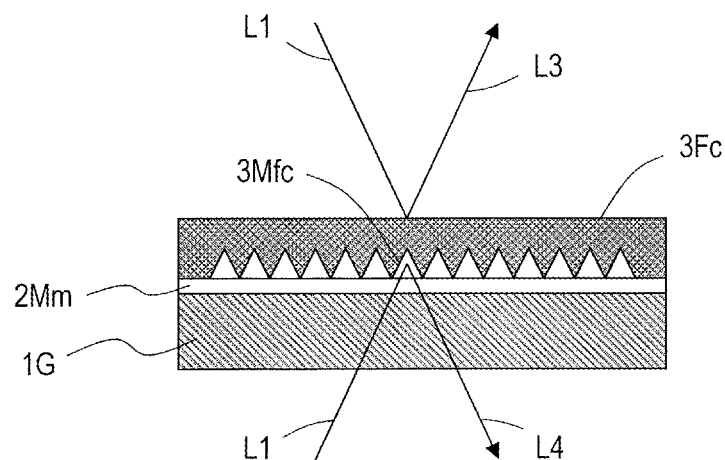

Next, refer to FIGS. 7(a) and 7(b). Here, as shown in FIG. 7(b), an aluminum layer having a thickness of about 1 µm was formed on an antireflection film 2Mm which had a moth-eye structure formed on the glass substrate 1G, and the spectral reflectance was measured at the opposite sides. The antireflection film 2Mm was obtained by forming an antireflection layer which had a moth-eye structure on a TAC film with the use of a photocurable resin.

The spectral reflectance of a flat surface 3Fc shown in the upper part of FIG. 7(b) (incident light L1, reflected light L3) was very high, specifically higher than 80%, over the entire measurement wavelength range such as shown by curve 7a in FIG. 7(a). On the other hand, the spectral reflectance of the interface 3Mfc which had an inverted moth-eye structure shown in the lower part of FIG. 7(b) (incident light L1, reflected light L4) was not more than 20% over the entire measurement wavelength range such as shown by curve 7b, and thus, it was found that it had an excellent antireflection effect. Note that the reflectance shown by curve 7b includes the reflectance of the surface of the glass substrate 1G (about 4%), and therefore, the reflectance from the interface 3Mfc which had an inverted moth-eye structure is still lower.

Figure 8:
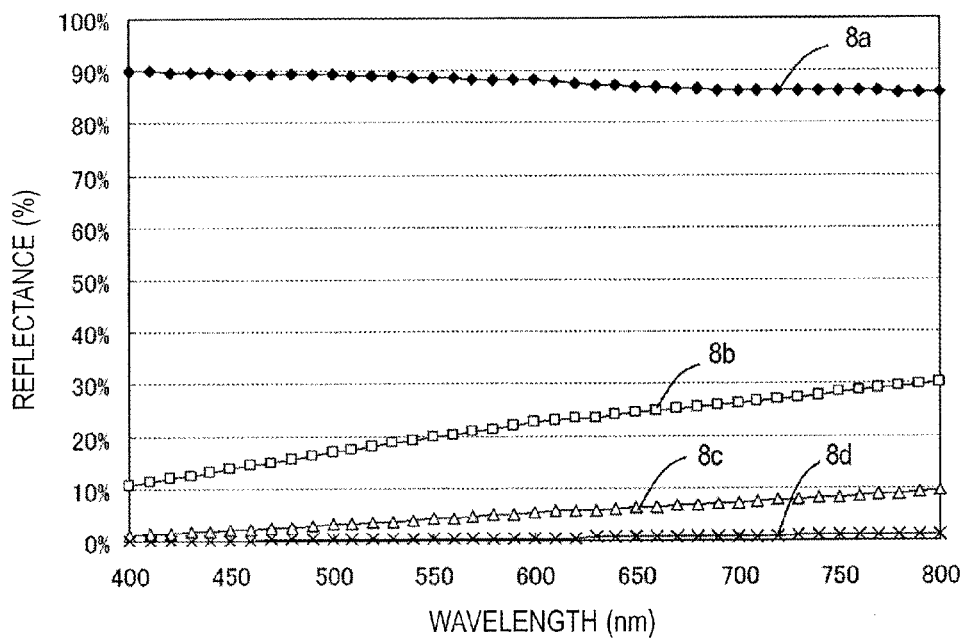
FIG. 8 A graph of the spectral reflectances of aluminum surfaces which have moth-eye structures, for illustrating the dependence on the height of raised portions.

Next, the dependence of the spectral reflectance of an aluminum surface which had a moth-eye structure on the height of raised portions (corresponding to the depth of recessed portions of the moth-eye mold, $D_{depth}$) is described with reference to FIG. 8. In FIG. 8, for the sake of comparison, the reflectance of the flat aluminum surface is represented by curve 8a. Curve 8b represents the simulation result for a moth-eye structure whose raised portions were 300 nm in height. Curve 8c represents the simulation result for a moth-eye structure whose raised portions were 900 nm in height. Curve 8d represents the simulation result for a moth-eye structure whose raised portions were 3000 nm in height.

As seen from the results of FIG. 8, also in the case of the aluminum surface, the antireflection effect improves as the height of the raised portions increases, although the antireflection effect is obtained even when the height of the raised portions that form the moth-eye structure is 300 nm.

Figure 9:
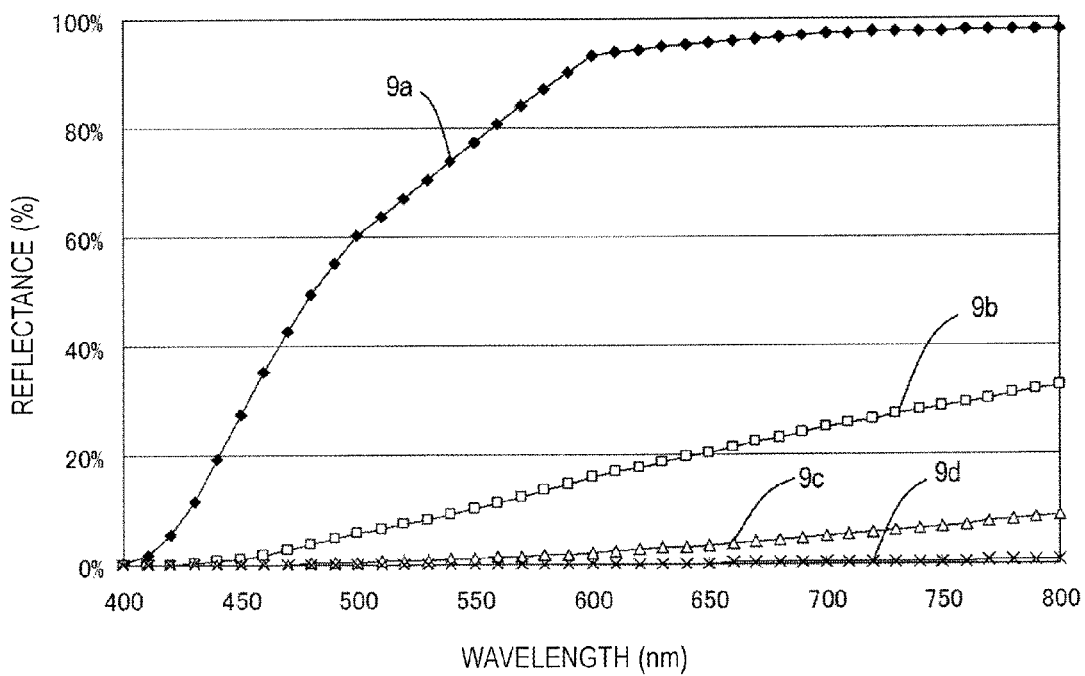
FIG. 9 A graph of the spectral reflectances of copper surfaces which have moth-eye structures, for illustrating the dependence on the height of raised portions.

Next, the dependence of the spectral reflectance of a copper surface which had a moth-eye structure on the height of raised portions (corresponding to the depth of recessed portions of the moth-eye mold, $D_{depth}$) is described with reference to FIG. 9. In FIG. 9, for the sake of comparison, the reflectance of the flat copper surface is represented by curve 9a. Curve 9b represents the simulation result for a moth-eye structure whose raised portions were 300 nm in height. Curve 9c represents the simulation result for a moth-eye structure whose raised portions were 900 nm in height. Curve 9d represents the simulation result for a moth-eye structure whose raised portions were 3000 nm in height.

As seen from the results of FIG. 9, also in the case of the copper surface, the antireflection effect improves as the height of the raised portions increases, although the antireflection effect is obtained even when the height of the raised portions that form the moth-eye structure is 300 nm.

In the case of an antireflection film having a moth-eye structure which is made of a photocurable resin, the reflectance can be decreased to 1% or lower over the entire visible light wavelength range when the height is about 300 nm. In the case of a metal surface, the height of the raised portions is preferably more than 300 nm, more preferably not less than 900 nm.

A metal layer which has a moth-eye type antireflection structure (moth-eye structure or inverted moth-eye structure) in its surface can be formed, for example, as described below.

Figure 10:
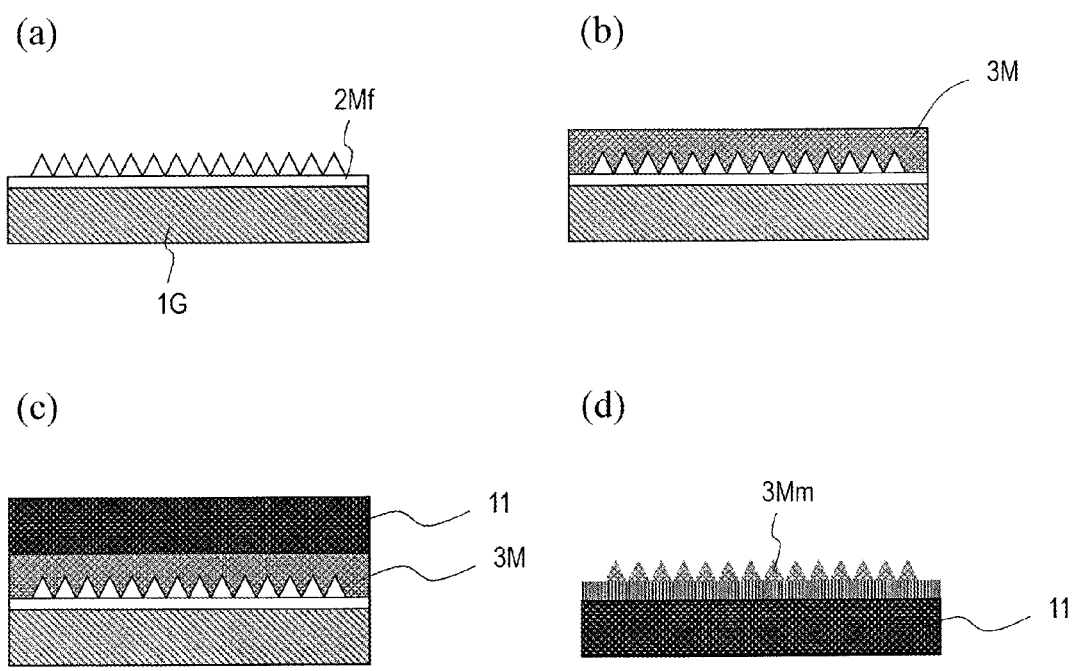
FIG. 10 (a) to (d) are schematic diagrams for illustrating a method for forming a metal layer which has a moth-eye type antireflection structure.

FIG. 10 is a schematic diagram for illustrating a method for forming a metal layer which has a moth-eye type antireflection structure. Hereinafter, an example of the method for forming a metal layer which has a moth-eye structure is described, although a metal layer which has an inverted moth-eye structure can also be formed in the same way with only a mold being replaced by a different one.

First, as shown in FIG. 10(a), a mold which has an inverted moth-eye structure (moth-eye mold) is provided. For example, a moth-eye mold 2Mf which is formed by a porous alumina layer is formed on a glass substrate 1G by a method disclosed in Patent Document 2. Here, the depth of the recessed portions, $D_{depth}$, is preferably more than 300 nm.

Then, as shown in FIG. 10(b), a metal layer 3M is deposited on a surface of the moth-eye mold 2Mf. The metal layer 3M may be formed in a vapor phase or may be formed in a liquid in which a metal is dissolved.

Then, as shown in FIG. 10(c), the substrate 11 is attached to the metal layer 3M using an adhesive agent, for example.

Thereafter, the metal layer 3M is peeled away from the moth-eye mold 2Mf, whereby a metal layer 3Mm which has a moth-eye structure in its surface is obtained as shown in FIG. 10(d).

As a matter of course, the mold having an inverted moth-eye structure which is firstly provided may be a mold in the shape of a roll. The base of the mold is not limited to a glass substrate but may be selected from bases of various materials.

Here, the method for forming a moth-eye structure or inverted moth-eye structure in the surface of metal wires and/or metal electrodes of the wiring board has been described, although the present invention is not limited to this example. The present invention is widely applicable to methods for forming a metal layer which has an antireflection surface. The metal layer which has an antireflection surface may be formed on, for example, the surface of a building material or the like. That is, in the above-described method, various bases may be used instead of the substrate 11, and a metal layer which has a moth-eye type antireflection surface can be formed on the surface of the various bases.

INDUSTRIAL APPLICABILITY

The present invention is widely applicable to a wiring board and a display panel including the same. Further, the present invention can be used for formation of metal layers which have various antireflection surfaces.

REFERENCE SIGNS LIST 11, 21 substrate
12M moth-eye type antireflection structure
100 liquid crystal display panel
100a TFT substrate
100b counter substrate
C contact hole
CE counter electrode
CS storage capacitance
CSB storage capacitance bus line
D drain electrode
DE drain extended line
GB gate bus line
SB source bus line
Mm moth-eye structure
Mf inverted moth-eye structure

The invention claimed is:

1. A wiring board, comprising:
   a substrate; and
   a plurality of metal wires provided on the substrate, wherein at least part of the plurality of metal wires has a moth-eye structure in its surface and a height of the moth-eye structure is not less than 900 nm, wherein the plurality of metal wires includes at least one of a gate bus line, a source bus line, a drain extended line and a storage capacitor line, and the at least part of the plurality of metal wires includes at least part of either of the gate bus line or the source bus line.

2. A display panel, comprising:
   a wiring board,
   a counter substrate which is provided on a viewer side of the wiring board, and
   a display medium layer which is provided between the wiring board and the counter substrate, wherein the wiring board includes a substrate and a plurality of metal wires provided on the counter substrate side of the substrate, and at least part of the plurality of metal wires is outside of pixel aperture regions and has a moth-eye structure or inverted moth-eye structure in its surface, wherein the plurality of metal wires includes at least one of a gate bus line, a source bus line, a drain extended line and a storage capacitor line, and the at least part of the plurality of metal wires includes at least part of either of the gate bus line or the source bus line.

3. The display panel of claim 2, wherein the counter substrate includes a light blocking layer, and the light blocking layer is arranged so as not to overlap the at least part of the plurality of metal wires.

* * * * *